(12) United States Patent
Greim et al.

(10) Patent No.: US 7,212,002 B2
(45) Date of Patent: May 1, 2007

(54) LOCAL COIL UNIT FOR USE IN A MAGNETIC RESONANCE APPARATUS

(75) Inventors: Helmut Greim, Adelsdorf (DE); Thomas Kundner, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 126 days.

(21) Appl. No.: 11/042,781

(22) Filed: Jan. 25, 2005

(65) Prior Publication Data

US 2005/0174117 A1  Aug. 11, 2005

(30) Foreign Application Priority Data

Feb. 2, 2004 (DE) ........................ 10 2004 005 120

(51) Int. Cl.
    *G01V 3/00* (2006.01)
(52) U.S. Cl. .................................... 324/318
(58) Field of Classification Search ............... None
    See application file for complete search history.

(56) References Cited

U.S. PATENT DOCUMENTS

| | | | |
|---|---|---|---|
| 4,831,330 A | 5/1989 | Takahashi | |
| 4,891,596 A | 1/1990 | Mitomi | |
| 5,327,898 A * | 7/1994 | Yoshino et al. | 600/422 |
| 5,477,146 A | 12/1995 | Jones | |
| 6,023,166 A * | 2/2000 | Eydelman | 324/318 |
| 6,060,882 A * | 5/2000 | Doty | 324/318 |
| 6,169,400 B1 * | 1/2001 | Sakuma | 324/318 |
| 6,300,761 B1 | 10/2001 | Hagen et al. | |
| 6,326,789 B1 * | 12/2001 | Yoshida et al. | 324/318 |
| 6,591,128 B1 * | 7/2003 | Wu et al. | 600/422 |
| 6,836,117 B2 * | 12/2004 | Tamura et al. | 324/318 |
| 7,049,819 B2 * | 5/2006 | Chan et al. | 324/319 |
| 2003/0076101 A1 * | 4/2003 | Sakuma et al. | 324/318 |
| 2003/0197508 A1 * | 10/2003 | Tamura et al. | 324/318 |

FOREIGN PATENT DOCUMENTS

| | | |
|---|---|---|
| DE | PS 198 54 928 | 12/2002 |
| DE | PS 10147 743 | 4/2003 |

OTHER PUBLICATIONS

Translation of Japanese Application 11092908.

* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

A local coil unit for acquisition of a magnetic resonance signal of an examination subject, and that can be placed directly on this examination subject, has a deformable section that can be adapted to a contour of the examination subject by a bending mechanism. During acquisition of the magnetic resonance signal, a high signal-to-noise ratio thus can be achieved, which leads to a good image quality. Due to its deformability, the local coil unit is suited for use for sensitive magnetic resonance data acquisition from different examination subjects.

24 Claims, 2 Drawing Sheets

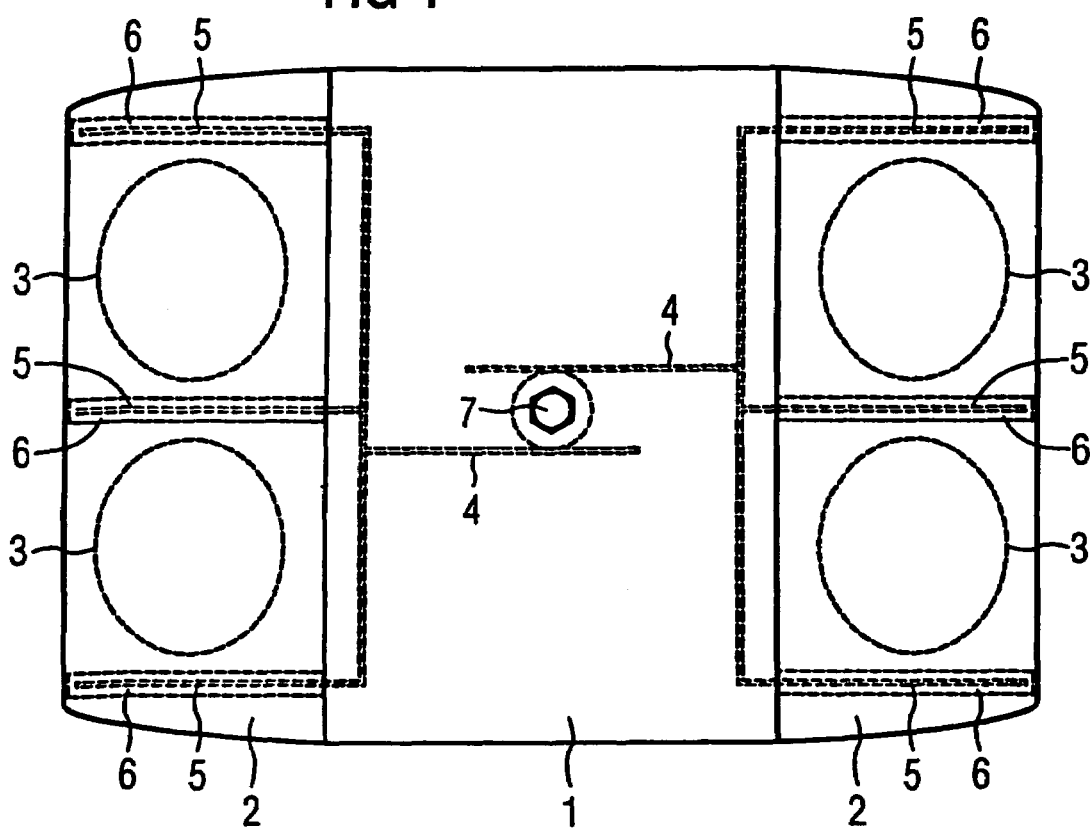
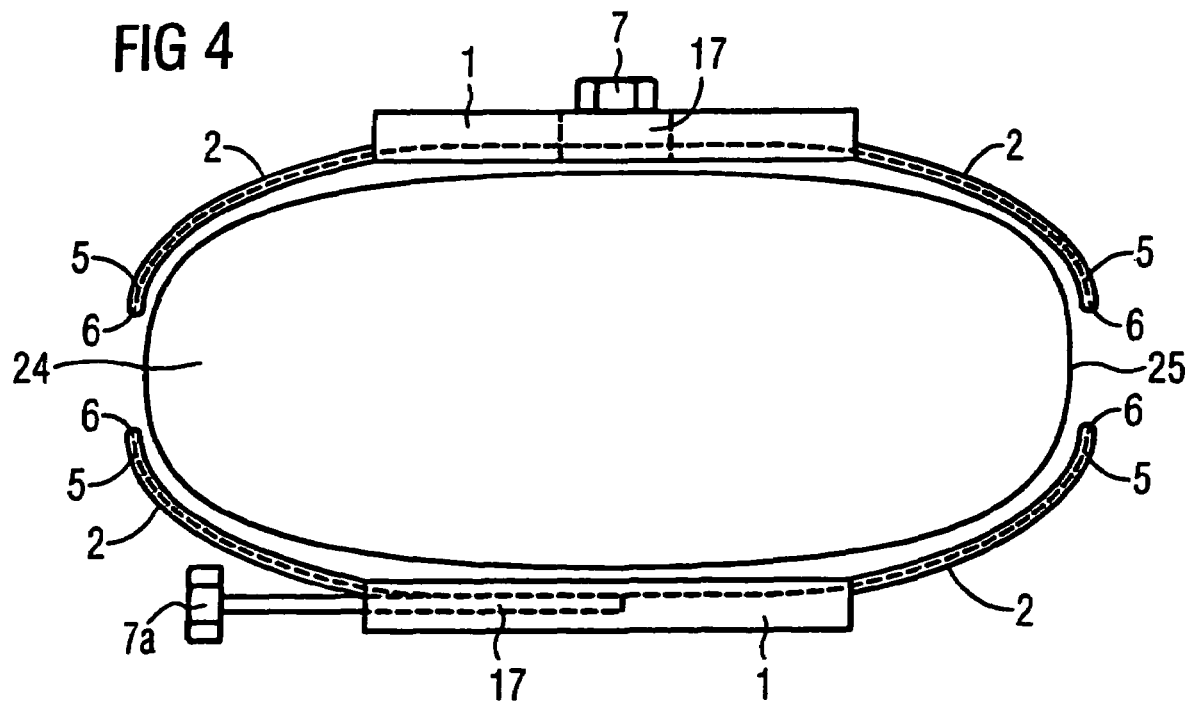

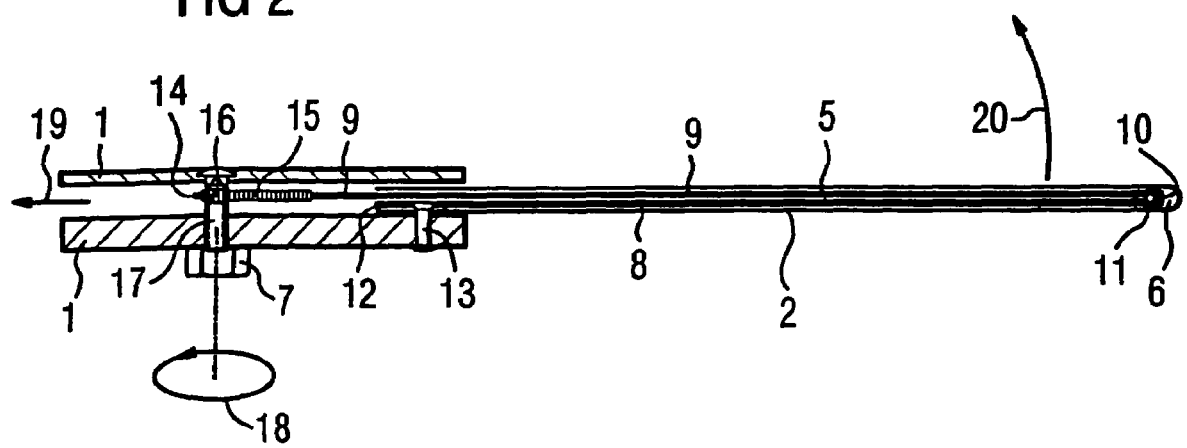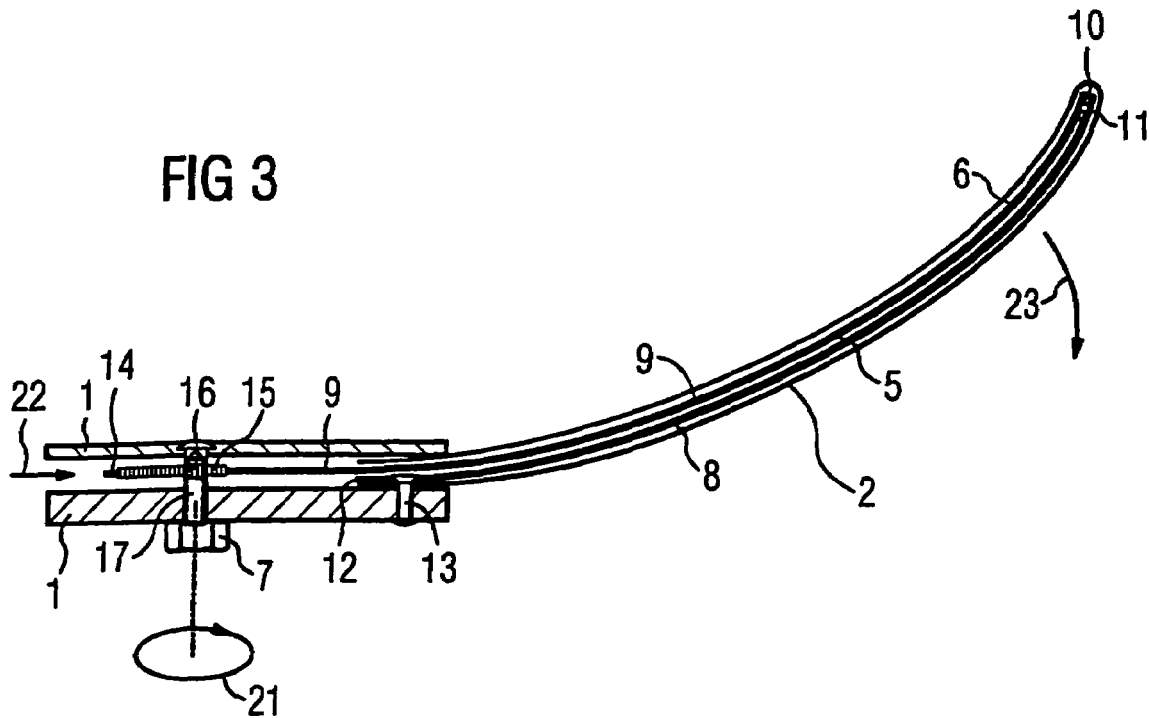

LOCAL COIL UNIT FOR USE IN A MAGNETIC RESONANCE APPARATUS

BACKGROUND OF THE INVENTION

1. Field of the Invention

The present invention concerns a local coil unit for use in a magnetic resonance apparatus, of the type wherein the local coil unit has a deformable section and can be adjusted set on an examination subject.

2. Description of the Prior Art

A local coil unit of the above type is known from German PS 198 54 924. In this known local coil unit, an antenna array for magnetic resonance examinations is formed of two parts and has a predefined contour for the examination of the lower extremities of the human body. This local coil unit therefore is not suited for examination of differently shaped examination subjects. The array elements attached on a middle web are fashioned to be partially flexible and thus can be adapted to the circumference of the lower extremities of each patient.

A device is known from German OS 198 54 928, having a belt system formed of a number of belt bands, by means of which a local coil unit can be affixed to a section of a patient. Handling of this device is impractical both for the patient and operating personnel, and the type of the attachment is constricting and unpleasant for many patients, even unbearable in the event that the patient experiences claustrophobia, as is common for many patients in a magnetic resonance apparatus U.S. Pat. No. 5,477,146 discloses a local coil unit formed of two parts for the acquisition of magnetic resonance signals in examinations of a human abdomen, in which both parts are connected via an axis such that they can be pivoted with respect to one another, and the local coil unit can be adjusted on the patient and be adapted to the patient's circumference, but not to the patient's individual contour.

German OS 38 19 541 discloses a magnetic resonance apparatus that has local coil units with rigid contours that are attached to arms, with the arms respectively being formed of a number of links connected such that they move with one another, so the arms are thus quasi-flexible. The local coil units are thereby adjustable on the examination subject. Due to the rigid contour of the local coil units, however, an optimal adaptation to the contour of the examination subject is not possible.

SUMMARY OF THE INVENTION

An object of the present invention is to design a local coil unit for use in a magnetic resonance apparatus to allow it to be adapted to the contour of the examination subject and thereby allow it to be handled simply, while not causing the local coil unit to be unpleasant to the patient.

This object is achieved in accordance with the invention by a local coil unit having a deformable section that carries at least a portion of an MR reception coil and that is adapted for replacement on an examination subject, and a bending mechanism connected to the deformable section that is activatable to case the deformable section to adapt to a contour of the examination subject.

The adaptation of the local coil unit to the contour of the examination subject thus requires only the activation of the bending mechanism. With simple handling, an optimal adaptation to the individual contour of the examination subject is thereby achieved.

In an embodiment of the local coil unit, the bending mechanism is designed such that, upon activation thereof, the deformable section of the local coil unit naturally nestles against the contour of the examination subject, which simplifies the handling for the operating personnel. The curvature thereby extends only on the regions of the deformable section of the local coil unit that do not yet lie on the examination subject, so upon activation of the bending mechanism the deformable section continuously adapts to the contour of the examination subject lying transverse to the curvature axis. Thus, for example, a local coil unit could be roughly adapted to the general shape of a human extremity and then be adapted by its deformable section to the individual contour and size of a particular patient.

The local coil unit preferably also has a non-deformable section. A fixed connection between the local coil unit and the magnetic resonance apparatus is thus unnecessary, which enables a use of the local coil unit in various similar magnetic resonance apparatuses.

An embodiment of the bending mechanism has at least one bending element that is coupled to the deformable section and thus transfers its curvature thereto. The bending element simultaneously serves as a support for the deformable section, which can be made of a soft material comfortable to the patient.

In a further embodiment the bending element is formed as at least one plastic strip. A particularly space-saving structure is thus achieved, which is advantageous in view of the often compact space relationships in the examination volume of magnetic resonance apparatuses.

Pockets for the acceptance of the plastic strip can be fashioned in the deformable section of the local coil unit, so the plastic strip can be completely integrated into the deformable section. This has the advantages of a further space savings and allowing a simple, hygienic cleaning after an examination has ensued, since the deformable section has a smooth, continuous surface both on the upper and lower sides, which surface can be quickly cleaned, for example with a disinfectant agent.

In another embodiment the bending mechanism has at least one further bending element. This is advantageous for the examination of larger examination subjects. This is useful, for example, for an examination of the upper body of a patient.

The deformable section of the local coil unit has at least one antenna for the acquisition of the magnetic resonance signal. An integration of a number of antennas into the deformable section is advantageous for the examination of larger examination subjects. This can be accomplished by the expansion (enlargement) capability afforded by the embodiment described immediately above.

DESCRIPTION OF THE DRAWINGS

FIG. 1 is a plan view of the local coil unit in accordance with the invention.

FIG. 2 is a section through the local coil unit of the invention in side view, in the un-curved state.

FIG. 3 is a section through the local coil unit of the invention in side view, in the curved state.

FIG. 4 is a side view of two local coil units in accordance with the invention on an examination subject.

DESCRIPTION OF THE PREFERRED EMBODIMENTS

A local coil unit is used for enhancement of the signal-to-noise ratio in the acquisition of magnetic resonance data. The best possible enhancement occurs with a minimal distance between the examination subject and the local coil unit. The local coil unit can include antennas both for the transmission of a magnetic resonance excitation signal and for reception of the resulting magnetic resonance signal.

The local coil unit shown in FIG. 1 has a non-deformable section 1 on which are fastened, on two opposite sides, two identically fashioned, deformable sections 2. In these deformable sections 2, two coils 3 are respectively integrated. Furthermore, the local coil unit has a bending mechanism 4 to bend the deformable sections 2, with which the coils 3 can be brought near to the examination subject and can be adapted to the subject's contour. An improved signal-to-noise ratio results therefrom. In the embodiment shown, the bending mechanism 4 has three bending elements 5 per deformable section 2. The bending elements 5 are located in pockets 6 that are fashioned on the deformable section 2. The bending mechanism 4, the operation of which is explained in detail using FIGS. 2 and 3, can be operated by a hand wheel 7.

FIG. 2 shows a side view of a section through one of the bending elements 5 in one of the pockets 6 of the deformable sections 2, and the hand wheel 7 in the non-deformable section 1. The bending element 5 is formed as two plastic strips 8 and 9 aligned parallel to each other that are affixed opposite on another at one end 10, for example by a rivet connection 11. The plastic strip 8 is connected with the non-deformable section 1 of the local coil unit with its other end 12, for example by a further rivet connection 13. The plastic strip 9 is longer than the plastic strip 8 and a row of teeth 15 is fashioned on its other end 14. This row of teeth 15 engages a gearwheel 16 that is connected via a connection piece 17 with the hand wheel 7. Rotation of the hand wheel 7 in the direction designated by the arrow 18 results in a tensile force pull on the plastic strip 9 along the direction designated by the arrow 19. Due to the fastening produced by the rivet connection 11 of the plastic strip 9 to the plastic strip 8 and its rivet connection 13 with the non-deformable section 1 of the local coil unit, the pull exerted by the hand wheel 7 effects a curving of both plastic strips 8 and 9 along the direction indicated by the arrow 20, with both plastic strips 8 and 9 being held together by the pocket 6. To maintain the curved state, in addition to the row of teeth 15 and the gear wheel 16, the displacement mechanism preferably has a ratchet mechanism (not shown) with which the curved state is maintained without the operating personnel having to continue to hold the hand wheel 7.

In a side view equivalent to FIG. 2, FIG. 3 shows the local coil unit with a curved deformable section 2. A return to the initial state shown in FIG. 2 with an un-curved deformable section 2 can ensue by release of the ratchet mechanism (not shown), whereupon the elastic force of the plastic strips 8 and 9 returns the deformable section 2 to the initial position. Should the elastic force be insufficient (for example due to material fatigue) in order to achieve the reset, a rotation of the hand wheel 7 in the direction shown by arrow 21 effects not only a reduction of the pull on the plastic strip 9, but also a shearing force push along the direction indicated by the arrow 22. The plastic strip 9 then move in the direction of the arrow 22, whereby the degree of the curvature in the direction of the arrow 23 reduces. Given further rotation of the hand wheel 7, curving in the direction of the arrow 23 is also possible that goes beyond the relaxed state shown in FIG. 2.

FIG. 4 shows one local coil unit above and one local coil unit below an examination subject 24 with a contour 25. The deformable sections 2 of the local coil unit are pre-formed to be roughly adapted in shape to the contour 25 of the examination subject 24. For the local coil unit below the examination subject 21, the hand wheel 7a is extended out of the deformable section 1 to the side for better operability.

In comparison to the embodiment shown in FIG. 1, the size of the local coil unit can be constructed both smaller and larger. For a larger version can more coils 3 can be integrated into larger deformable sections 2. Likewise, additional pockets 6 can accommodate additional bending elements 5. A smaller version can be formed of one deformable section 2 that has one coil 3 and is attached to a non-deformable section 1. The bending mechanism then may include only one of the bending elements 5 that is contained in one of the pockets 6.

Although modifications and changes may be suggested by those skilled in the art, it is the intention of the inventors to embody within the patent warranted hereon all changes and modifications as reasonably and properly come within the scope of their contribution to the art.

We claim as our invention:

1. A local coil unit for a magnetic resonance apparatus, comprising:
   a coil adapted to receive magnetic resonance signals from an examination subject;
   a deformable section, carrying at least a portion of said coil, adapted for placement on the examination subject; and
   an activatable and deactivatable bending mechanism connected to said deformable section that, when activated, exerts a force on said deformable section that deforms substantially all of said deformable section to adapt said deformable section to a contour of the examination subject.

2. A local coil unit as claimed in claim 1 wherein said bending mechanism deforms said deformable section to cause said deformable section to naturally nestle against said contour.

3. A local coil unit as claimed in claim 1 wherein said deformable section has a substantially non-deformed rest shape, and wherein said deformable section is returnable, upon deactivation of said bending mechanism, to said rest shape.

4. A local coil unit as claimed in claim 1 comprising a non-deformable section connected to said deformable section.

5. A local coil unit as claimed in claim 4 wherein said bending mechanism is attached to both of said non-deformable section and said deformable section.

6. A local coil unit as claimed in claim 1 wherein said bending mechanism comprises at least one adjustment element that curves said deformable section.

7. A local coil unit as claimed in claim 6 wherein said adjustment element is a device for exerting a pulling force on said deformable section.

8. A local coil unit as claimed in claim 7 wherein said pulling device exerts said pulling force in a direction along said contour.

9. A local coil unit as claimed in claim 1 wherein said bending mechanism comprises at least one bending element.

10. A local coil unit as claimed in claim 9 wherein said bending element is mechanically coupled with said deformable section.

11. A local coil unit as claimed in claim 9 wherein said deformable section has a substantially non-deformed rest shape, and wherein said bending element returns said deformable section to said rest shape upon deactivation of said bending mechanism.

12. A local coil unit as claimed in claim 9 wherein said bending element comprises at least one plastic strip.

13. A local coil unit as claimed in claim 12 wherein said bending mechanism comprises a pulling device for applying a pulling force in a pull direction to said plastic strip, and wherein said plastic strip is aligned along said pull direction.

14. A local coil unit as claimed in claim 12 wherein said bending mechanism comprises a pulling device, manually operable by a hand wheel, to apply a pulling force to said plastic strip, said pulling device comprising a gear wheel, co-rotatable with said hand wheel, having a plurality of gear teeth, and wherein said plastic strip has a plurality of teeth engaging said gear teeth.

15. A local coil unit as claimed in claim 14 wherein said plastic strip is a first plastic strip, and comprising at least one second plastic strip disposed between said teeth and an end of said first plastic strip, and wherein said local coil unit comprises a non-deformable section, with said second plastic strip being fastened to said non-deformable section.

16. A local coil unit as claimed in claim 15 wherein said deformable section comprises a guide for accepting said first and second plastic strips.

17. A local coil unit as claimed in claim 16 wherein said guide comprises a pocket in said deformable section.

18. A local coil unit as claimed in claim 1 wherein said bending mechanism comprises a plurality of bending elements.

19. A local coil unit as claimed in claim 18 wherein said plurality of bending elements are mechanically coupled to said deformable section.

20. A local coil unit as claimed in claim 19 wherein said bending mechanism comprises an adjustment element that curves all of said bending elements to deform said deformable section.

21. A local coil unit as claimed in claim 1 comprising a non-deformable section connected to said deformable section, and at least one further deformable section also connected to said non-deformable section.

22. A local coil unit as claimed in claim 21 wherein said non-deformable section has opposite sides, and wherein said deformable section an said further deformable section are respectively connected to said opposite sides of said non-deformable section.

23. A local coil unit as claimed in claim 1 wherein said at least a portion of said coil is integrated in said deformable section.

24. A local coil unit as claimed in claim 1 wherein said bending mechanism comprises an actuator that is operable to activate and deactivate said bending mechanism, and a mechanical connection between said actuator and said deformable section that applies said force to said deformable section when said actuator is activated.

* * * * *